(12) United States Patent
Aoki et al.

(10) Patent No.: US 6,801,094 B2
(45) Date of Patent: Oct. 5, 2004

(54) PHASE COMPARATOR

(75) Inventors: Tomonari Aoki, Kanagawa (JP); Kazuhiro Nakajima, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/365,131

(22) Filed: Feb. 12, 2003

(65) Prior Publication Data

US 2003/0151463 A1 Aug. 14, 2003

(30) Foreign Application Priority Data

Feb. 13, 2002 (JP) ........................................ 2002-035118

(51) Int. Cl.[7] ................................................ H03L 7/00
(52) U.S. Cl. ........................................ 331/25; 331/1 A
(58) Field of Search .................. 331/25, 1 A; 327/156, 327/159, 161, 3, 12; 375/376

(56) References Cited

U.S. PATENT DOCUMENTS 5,736,872 A * 4/1998 Sharma et al. .................. 327/3
5,963,059 A * 10/1999 Partovi et al. ................. 327/12
6,249,188 B1 * 6/2001 Kaneko ........................ 331/17

FOREIGN PATENT DOCUMENTS

JP 2000-40957 8/2000

OTHER PUBLICATIONS

Sidiropoulus et al., "A Semidigital Dual Delay–Locked Loop," *IEEE Journal of Solid–State Circuits*, vol. 32, No. 11, Nov. 1997, pp. 1683–1692.

* cited by examiner

*Primary Examiner*—Arnold Kinkead
(74) *Attorney, Agent, or Firm*—Darryl G. Walker; Bradley T. Sako

(57) ABSTRACT

A phase comparator is disclosed that can provide a phase comparison result at high speed that essentially does not vary according a power source voltage, ambient temperature and/or manufacturing process conditions, or the like. A phase comparator (10) may include one-shot pulse generating units (14 and 24) that output one-shot pulses according to input data signal DAT and clock signal CLK, respectively. An R-S flip-flop (16) can receive one-shot pulses from one-shot pulse generating units (14 and 24) at set and reset inputs, respectively. An output flip-flop (17) can select between an output signal of R-S flip-flop (16) and a delay signal "a8" generated from input data signal DAT, and latch such a result according to a delayed clocks signal CLK.

20 Claims, 4 Drawing Sheets

PHASE COMPARATOR

TECHNICAL FIELD

The present invention relates generally to a phase comparator, and more particularly to a phase comparator suitable for use in a phase locked loop (PLL) type circuit that can generate a clock signal.

BACKGROUND OF THE INVENTION

Phase comparators are widely used in phase locked loop (PLL) type circuits. PLL type circuits are commonly used to generate a clock pulse.

FIG. 4 shows a conventional phase comparator used in a PLL circuit as described in Japanese Patent Publication 2000-40957 (JP 2000-40957). Referring to FIG. 4, a conventional phase comparator 40 may consist of an inverter 41, D-type flip-flops (D-F/Fs) 42, 43 and 44, and a selector 45. An input signal DAT can be received by D-F/F 42 along with a clock signal CLK, that is the output of a voltage controlled oscillator (VCO). An output signal from D-F/F 42 can be latched in D-F/F 43, which functions as a first latch, while an inverted output signal from D-F/F 42 can be latched in D-F/F 44, which functions as a second latch.

A discriminator 46, which is a D-F/F, can reproduce pulses of a clock signal based on input signal DAT. An output from discriminator 46 may be provided as a clock input to first latch 43, while an inverted output from discriminator 46 may be provided as a clock input to second latch 44. Outputs from first and second latches (43 and 44) are input to selector 45. The selector 45 outputs an output value from first latch 43 when an output signal from discriminator 46 has a first level "1", and the selector 45 outputs an output value from second latch 44 when an output signal from discriminator 46 has a second level "0."

With the above described conventional configuration, the phase comparator 40 outputs a signal level of "1" when the phase of an input data signal DAT leads that of the clock signal CLK. Conversely, the phase comparator 40 outputs a signal level of "0" when the phase of an input data signal DAT lags that of the clock signal CLK.

FIG. 5 shows another conventional phase comparator described in "A Semidigital Dual Delay-Locked Loop," *IEEE Journal of Solid-State Circuits*, Vol. 32, No. 11, November 1997, pp. 1683 to 1692, by Sidiropoulos et al. The phase comparator 50 of Sidiropoulos et al. includes first and second one-shot pulse generating circuits 51 and 52, respectively, and an R-S flip-flop 53. First and second one-shot pulse generating circuits 51 and 52 generate one-shot pulses from two input clocks $C_0$ and $C\pi$, respectively, to provide an inverted set input "/S" and an inverted reset input "/R." R-S flip-flop 53 receives the inverted set input "/S" and an inverted reset input "/R," and provides an "up" output and "dn" output. In particular, when the clock signal $C\pi$ is leading in phase with respect to the clock signal $C_0$, R-S flip-flop 53 provides an output signal at level "1" to output "up." When the clock signal $C\pi$ is lagging in phase with respect to the clock signal $C_0$, R-S flip-flop 53 provides an output signal at level "1" to output "dn."

In the conventional phase comparator 40 of FIG. 4, discriminator 46 discriminates and reproduces pulses of a clock signal CLK synchronously with respect to input data signal DAT. A comparison result is thus output after reception of the clock output from discriminator 46. Therefore, a drawback to such an arrangement can be that a comparison result is delayed due to the output timing of discriminator 46, hence reducing the speed at which a comparison result can be output.

In addition, in the arrangement of FIG. 4, a delay of inverter 41 and a set-up and hold time for D-F/F 42 can vary. Such a variation may arise from variations in a power source voltage of a phase comparator 40, the ambient operating temperature of the phase comparator 40, and/or process variations in the manufacturing process for the phase comparator 40, or the like. Thus, the conventional approach of FIG. 4 may have the drawback of variation in the phase difference that is detectable by the circuit. Such a variation results in differences in the sensitivity at which a phase comparison between the input data signal DAT and the clock signal CLK can be made. Such a detection sensitivity determines the point at which an output of a D-F/F 42 transitions between "1" and "0."

In the conventional phase comparator 50 of FIG. 5, a drawback can arise when a difference in duty ratio cycles between the two input clocks $C_0$ and $C\pi$ is large. In particular, if a duty ratio difference is sufficiently large, a phase comparison may not be accurately made.

In light of the above mentioned drawbacks of conventional phase comparators, it would be desirable to arrive at a phase comparator in which the sensitivity of a phase comparison is less susceptible, as compared to conventional approaches, to variations in power supply voltage, ambient temperature, and/or process conditions.

It would also be desirable to arrive at a phase comparator that may stably and/or rapidly provide a phase comparison result, even when the duty cycles of two input signals for comparison vary from one another.

SUMMARY OF THE INVENTION

The present invention may include a phase comparator for determining a phase lead or phase lag between phases of a first pulse signal and a second pulse signal. A phase comparator may include a reset-set (R-S) flip-flop that is set or reset in accordance with a phase difference between the first pulse signal and the second pulse signal, and a D-type flip-flop that latches an output from the R-S flip-flop according to a clock input, the clock input being a delay pulse signal obtained by delaying the second pulse signal.

According to the present invention, because a D-type flip-flop can latch an output from an R-S flip-flop according a delayed second signal, it can be possible to output a comparison result within a pulse period of the second signal. In addition, even if duty cycles of a first pulse signal and second pulse signal are not the same, a stable phase comparison between the two may be carried out.

According to one aspect of the embodiments, a first one-shot pulse generator can receive a first pulse signal as an input and provide an output to a set input of a R-S flip-flop. In addition, a second one-shot pulse generator can receive a second pulse signal as an input and provide an output to a reset input of a R-S flip-flop.

According to another aspect of the embodiments, first and second one-shot pulse generators can be composed of essentially identical circuit elements.

According to another aspect of the embodiments, a D-type flip-flop can include a logic gate that receives as inputs a delayed first signal and an output of the R-S flip-flop, and a latch circuit that latches the output of the logic gate. In particular arrangements, a logic gate can include a NAND gate. Further, a latch circuit can include at least two latch stages connected in a cascade fashion.

According to another aspect of the embodiments, a phase comparator can be composed entirely of complementary metal-insulator-semiconductor field effect transistors. In such an arrangement, a delay due to a variation in an external condition, such as a power source voltage, an ambient temperature, process conditions, or the like, are varied in the same general fashion among all such circuit elements. As a result, variations in the sensitivity of a phase comparator due to variations in such conditions can be suppressed.

The present invention may also include a phase comparator circuit having a first pulse generating circuit for generating first pulses corresponding to a first signal phase, a second pulse generating circuit for generating second pulses corresponding to a second signal phase, and a pulse receiving circuit that provides a detect output that has a first value in response to a first pulse and a second value in response to a second pulse. A phase comparator may also include an output circuit for logically combining the detect output with a delayed second signal.

According to one aspect of the embodiments, first and second pulse generating circuits can have an essentially identical circuit structure.

According to another aspect of the embodiments, first and second pulse generator circuits can each include a delay unit for providing a delayed signal and a pulse gate for logically combining the delayed signal with a non-delayed signal.

According to another aspect of the embodiments, a pulse receiving circuit can include a reset-set flip-flop circuit having a set input that receives the first pulses and a reset input that receives the second pulses.

According to another aspect of the embodiments, an output circuit can include a logic gate that logically combines the detect output with a delayed second signal to generate a gate output signal and at least one latch that latches the gate output signal.

According to another aspect of the embodiments, at least one latch can include a plurality of latch stages that latch the output signal according to a delayed second signal.

According to another aspect of the embodiments, a first pulse generating circuit, a second pulse generating circuit, a pulse receiving circuit, and an output circuit can be formed from complementary insulated gate field effect transistors.

The present invention may include a phase comparator having a pulse input circuit that provides a first output value in response to pulse generated from a first signal and a second output value in response to pulses generated from a second signal. A phase comparator may also include an output circuit that includes at least one input gate that outputs either a delayed first signal or a logical combination of the delayed first signal and the output value from the pulse input circuit.

According to one aspect of the embodiments, a pulse input circuit can include a reset-set flip-flop circuit.

According to another aspect of the embodiments, an output circuit may further include a plurality latches for latching the output of the at least one input gate in response to a delayed second signal.

According to another aspect of the embodiments, at least one input circuit may include a NAND gate.

According to another aspect of the embodiments, a phase comparator may also include a first pulse generating circuit for receiving a first signal and generating pulses in response thereto that represent a phase of the first signal, and a second pulse generating circuit, having essentially the same structure of the first pulse generating circuit, for receiving a second signal and generating pulses in response thereto that represent a phase of the second signal.

According to another aspect of the embodiments, a pulse input circuit and output circuit can be formed from complementary insulated gate field effect transistors.

DETAILED DESCRIPTION OF THE EMBODIMENTS

The present invention will hereinafter be described in more detail on the basis of various particular embodiments with reference to accompanying figures.

Figure 1:
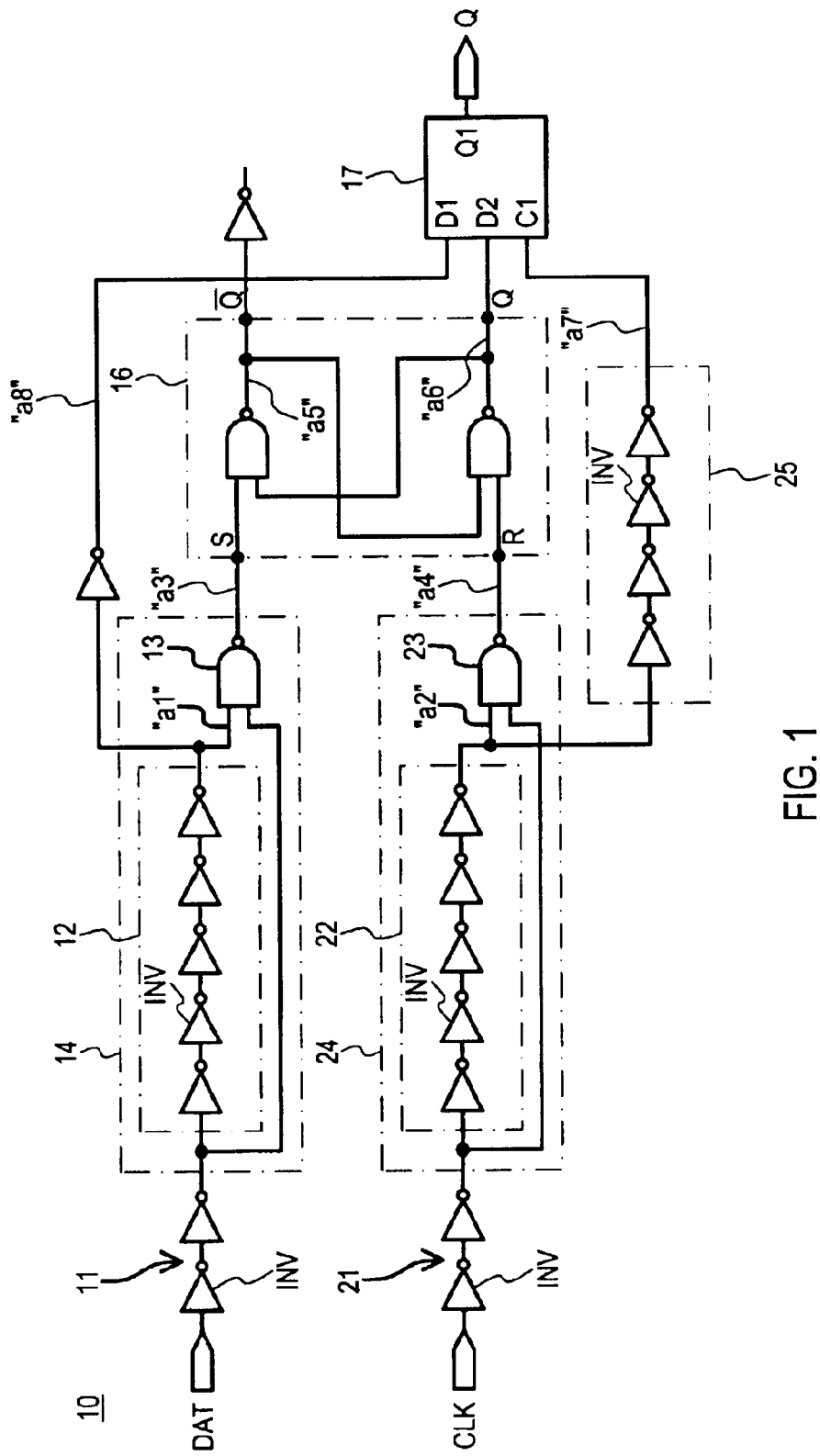
FIG. 1 is a circuit diagram showing a phase comparator according to one embodiment of the present invention.

FIG. 1 is a block schematic diagram of a phase comparator according to one embodiment of the present invention. A phase comparator is designated by the general reference character 10 and may compare the phases of two input signals and provide a comparison result as an output signal Q1. Output signal Q1 can be provided by an output flip-flop 17.

In the arrangement of FIG. 1, two input signals can include a data signal DAT and a clock signal CLK. Further, a phase comparator 10 may output a "1" as an output signal Q1 when an input data signal DAT is leading in phase with respect to a clock signal CLK, and may output a "0" as an output signal Q1 when an input data signal DAT is lagging in phase with respect to a clock signal CLK.

An input data signal DAT can be input to a one-shot pulse generating circuit 14 through an input buffer unit 11. A one-shot pulse generating circuit 14 may include a NAND gate 13 and a delay circuit 12 in which an odd number of stages (2n+1) of inverters (INV) are connected in a cascade fashion. An input buffer unit 11 may include two stages of inverters (INV) connected in a cascade fashion. One-shot pulse generating circuit 14 may provide an output signal "a3" as a set input "S" of an R-S flip-flop 16.

A clock signal CLK can be input to a one-shot pulse generating circuit 24 through an input buffer unit 21. A one-shot pulse generating circuit 24 may include a NAND gate 23 and a delay circuit 22 in which an odd number of stages (2n+1) of inverters (INV) are connected in a cascade fashion. An input buffer unit 21 may include two stages of inverters (INV) connected in a cascade fashion. One-shot pulse generating circuit 24 may provide an output signal "a4" as a reset input "R" of an R-S flip-flop 16.

The configuration of an input buffer unit 11 (which may receive input data signal DAT) and one-shot pulse generating circuit 14 can be essentially the same as that of input buffer 21 (which may receive clock signal CLK) and one-shot pulse generating circuit 24, respectively. With such an arrangement, a propagation time through such circuits for an input data signal DAT can be essentially identical to that of clock signal CLK.

A delay circuit 12 may provide a DAT delayed signal, shown as "a1." Such a DAT delayed signal a1 can be inverted by an inverter 15 to provide an output signal "a8." Output signal "a8" can be provided to a first data input "D1" of output flip-flop 17.

An output signal "a6" from R-S flip-flop 16 can be provided as a second data input "D2" of output flip-flop 17.

A delay circuit 22 of one-shot pulse signal generating circuit 24 may provide a delay signal "a2." Such a delay signal a2 can be further input to a delay circuit 25, which may have an even number of stages (2m) of inverters (INV) connected in a cascade fashion. Delay circuit 25 may provide delay signal "a7" as an output signal. Delay signal "a7" can be provided as a clock input "C1" of output flip-flop 17.

Figure 2:
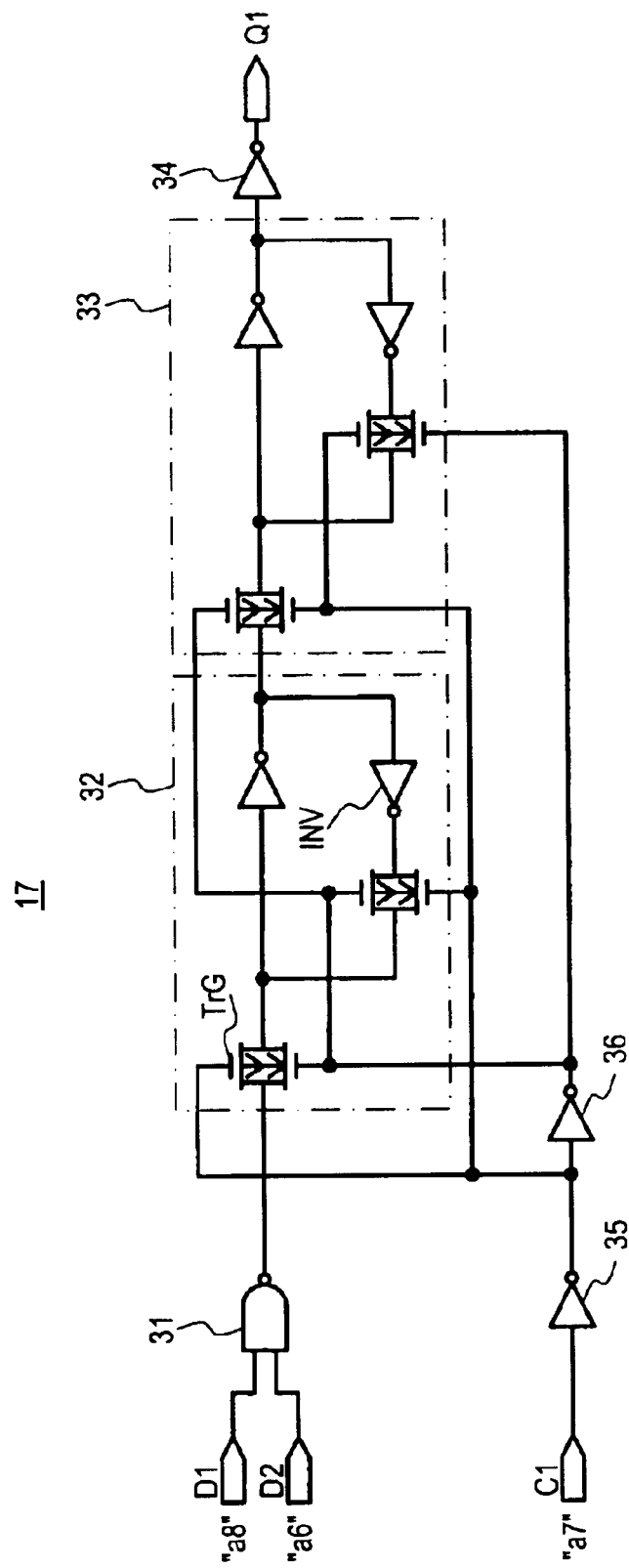
FIG. 2 is a circuit diagram of an output flip-flop that may be used in a phase comparator like that of FIG. 1, according to one embodiment of the present invention.

An example of an output flip-flop, like that shown as item 17 in FIG. 1, is shown in a schematic diagram in FIG. 2. FIG. 2 shows an output flip-flop 17 that may include a NAND gate 31, a first latch 32, a second latch 33, and inverters 34, 35 and 36. A NAND gate 31 can receive an output signal "a8," generated from DAT delayed signal "a1" as one input, and output signal "a6" from R-S flip-flop 16 as another input.

A first latch 32 may receive an output from NAND gate 31. A first latch 32 can invert an output signal from NAND gate 31 and latch such a signal in response to a high clock signal CLK. A second latch 33 can invert an output signal from first latch 32 and latch such a signal in response to a low clock signal CLK. An inverter 34 can invert an output of second latch 33 to provide output signal Q1. Inverters 35 and 36 can provide non-inverted and inverted clock signals, respectively.

Figure 3:
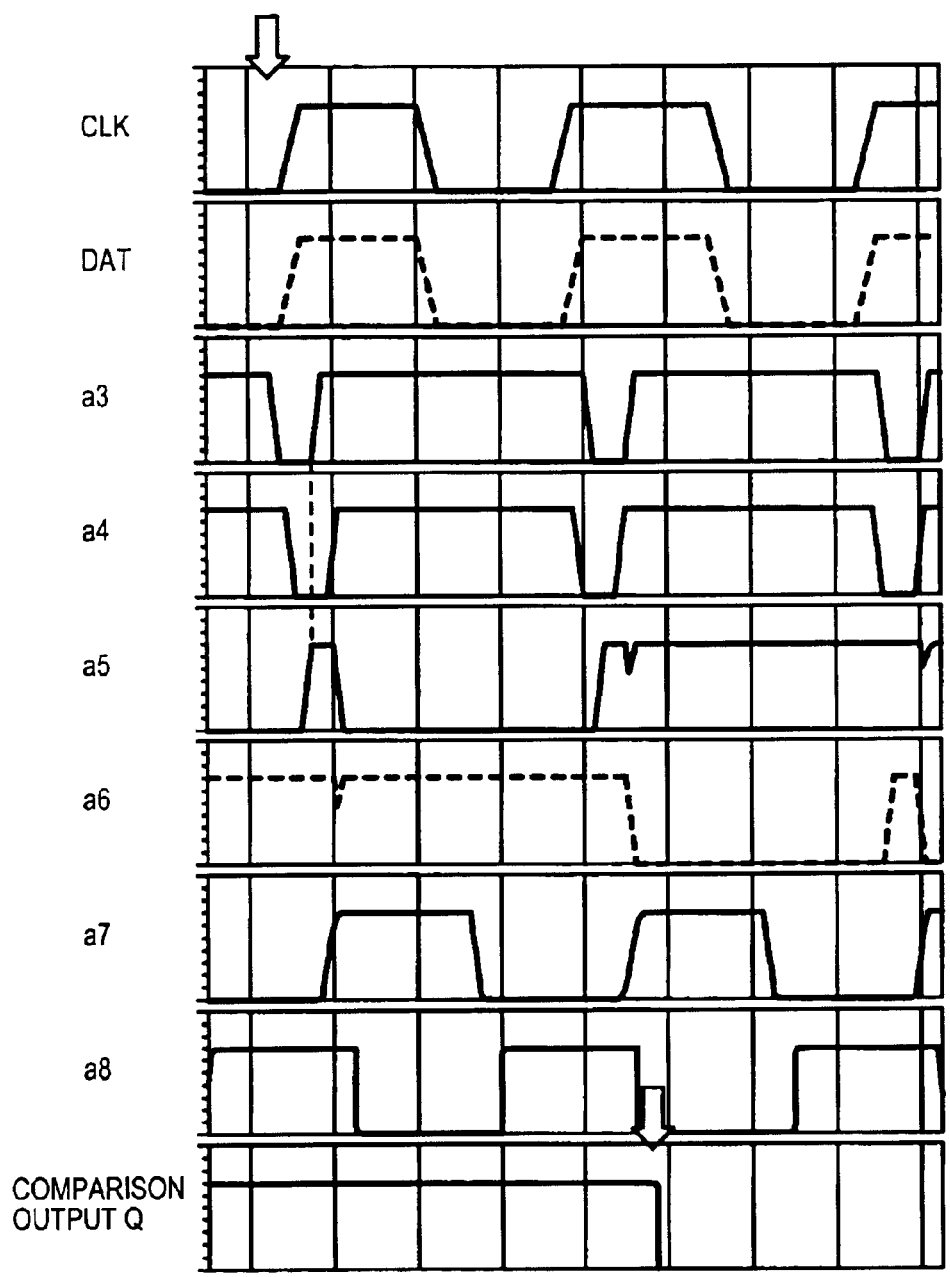
FIG. 3 is a timing diagram showing an example operation of a phase comparator like that of FIG. 1, according to one embodiment of the present invention.
Figure 4:
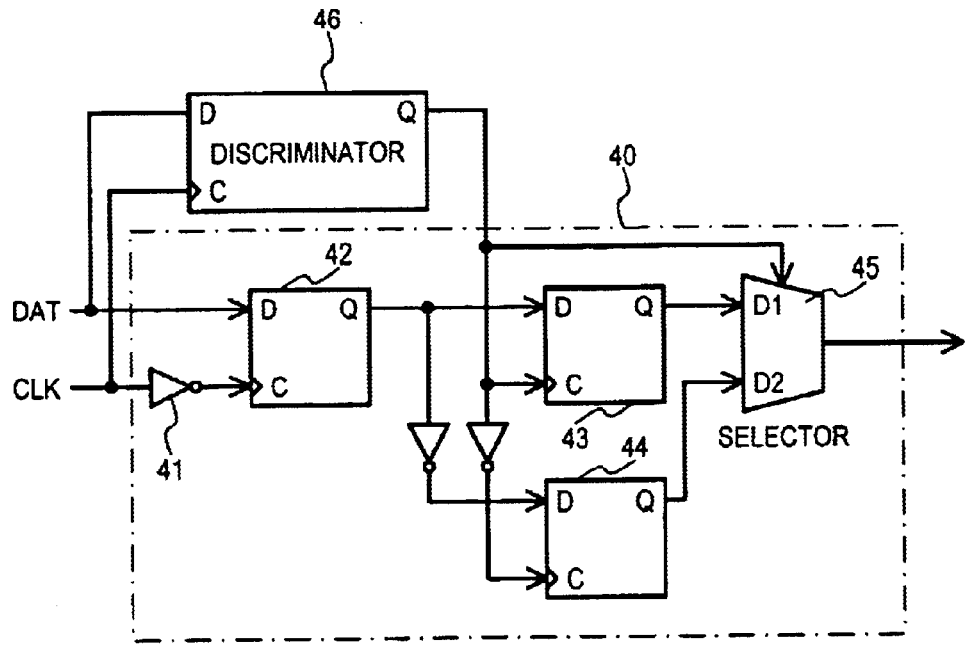
FIG. 4 is a circuit diagram showing a conventional phase comparator.
Figure 5:
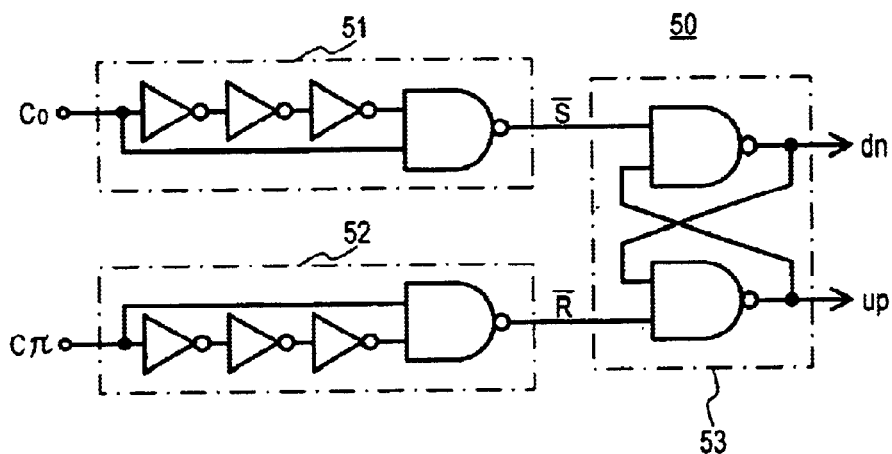
FIG. 5 is a circuit diagram showing another conventional phase comparator.

FIG. 3 shows a timing diagram showing a response for various signals shown in the phase comparator 10 embodiment of FIG. 1. FIG. 3 initially shows an example in which a first pulse of an input data signal DAT can lead, in phase, a pulse of clock signal CLK.

A one-shot pulse shown in response "a3" can be generated by one-shot pulse generating circuit 14 in response to a rising edge of input data signal DAT, and can have a negative polarity. Similarly, a one-shot pulse shown in response "a4" can be generated by one-shot pulse generating circuit 24 in response to a rising edge of clock signal CLK, and can have a negative polarity. In the example of FIG. 3, a pulse in response "a3" can lead in phase with respect to a pulse of response "a4."

Referring still to the example of FIG. 3 in conjunction with FIG. 1, one-shot pulses from "a3" and "a4" may be received at the set and reset inputs, respectively, of R-S flip-flop 16. Because the first one-shot pulse of "a3" arrives at the set input of R-S flip-flop 16 first, and rises earlier than the one-shot pulse of "a4", apart from a small transient period, an R-S flip-flop 16 can be "set". Consequently, a non-inverted output signal "a6" and an inverted output "a5" of R-S flip-flop 16 can be "1" and "0", respectively.

An output flip-flop 17 can operate, in principle, in the following fashion. Provided a DAT response (e.g., an input data signal DAT as delayed by a delay circuit 12 and an inverter 15) is active, an output signal "a6" from R-S flip-flop 16 can be latched by an output flip-flop 17. Such a latching may occur in two stages by two clock pulses of a clock signal CLK (as received at a clock input C1), to thereby provide an output signal Q1 from a phase comparator 10. In this way, a phase comparator 10 may judge when an input data signal DAT leads in phase with respect to a clock signal CLK.

Because an output flip-flop 17, like that of FIG. 2, can include two stages of latch circuits, such an output flip-flop 17 can hold a stable output signal even in the presence of disturbances between clock pulses.

In addition, an output flip-flop 17 can include an input stage that logically combines a signal being detected with a detection result. In FIG. 2, such an input stage is shown as a NAND gate 31 that can receive a delay signal "a8" (e.g., an input data signal DAT delayed by a delay circuit 12 and an inverter 15) and an output signal "a6" of an R-S flip-flop 16. With such an arrangement, when an input signal (e.g., DAT signal) is not active (in this case a logic "0") an output signal of an output flip-flop 17 can be fixed at a level "0". Fixing an output of a flip-flop 17 to "0" in this fashion can be advantageous, because if an input signal DAT is inactive, there can be no need to compare such a signal to pulses in a clock signal CLK.

Referring back to FIG. 3, in a next clock cycle, a clock signal CLK may lead in phase with respect to an input data signal DAT. In this case, since a one-shot pulse response "a4", corresponding to a clock signal CLK, may rise earlier than a one-shot pulse of response "a3", corresponding to an input data signal DAT, an R-S flip-flop 16 can be placed in a "reset" state. Consequently, a non-inverted output of R-S flip-flop 16 "a6", can go low to logic "0", while an inverted output of R-S flip-flop "a5", can go high to logic "1" after a transient period of time. This can result in output "Q1" of output flip-flop 17 becoming a logic "0." That is, a phase comparator 10 can have determined that an input signal DAT lags in phase with respect to a clock signal CLK.

In the embodiment of FIG. 1, it is noted that a delayed clock signal "a7" can be provided as a clock input "C1" to an output flip-flop 17. In such an arrangement, a comparison result obtained by comparing phases of an input data signal DAT and a clock signal CLK can be taken during a the clock period of time in which both signals are input.

In addition, by including a gate at an input stage of output flip-flop 17, such as NAND gate 31, even if an input data signal DAT is stopped, an output of phase comparator 10 can be held at a specific value. Such an arrangement can allow phase comparator 10 to operate with greater stability than other conventional approaches.

Furthermore, it is noted that a phase comparator 10 may be formed from basic blocks of complementary metal-oxide-semiconductor (CMOS) circuits. As noted above, input circuits for an input data signal DAT and a clock signal CLK (e.g., the one-shot circuits and the like) can have the same configuration. Therefore, variation in operation can be greatly reduced, as variations due to manufacturing conditions can affect such circuit portions in an essentially identical fashion. Further, variations in a power source voltage and/or in an ambient operating temperature may also affect such circuit portions in an essentially identical fashion. As a result, a phase comparator 10 can provide a stable output with a comparison sensitivity that can be essentially free from adverse effects arising from differences in power source voltages, ambient operating temperatures and/or process conditions used to manufacture such a circuit.

In the embodiment shown in FIG. 1, selecting a suitable number of inverters for delay circuits (e.g., 12 and 22) can make it possible to change the resolution of a phase difference between the signals being compared.

As has been shown above, according to a phase comparator of the present invention, a phase comparison may be made with a sensitivity that can be essentially not influenced by differences in a power source voltage, ambient temperature, and/or process conditions used to manufacture the phase comparator. Such a phase comparator may provide a stable and rapid compare result, even if cycles of both signals being compared are not identical to one another.

The present invention has been described on the basis of particular embodiments. However, the present invention should not be construed as being limited thereto.

Thus, while various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A phase comparator for determining a phase lead or phase lag between phases of a first pulse signal and a second pulse signal, comprising:
    a reset-set (R-S) flip-flop that is set or reset in accordance with a phase difference between the first pulse signal and the second pulse signal; and
    a D-type flip-flop that latches an output from the R-S flip-flop according to a clock input, the clock input being a delay pulse signal obtained by delaying the second pulse signal.

2. The phase comparator of claim 1, further including:
    a first one-shot pulse generator that receives the first pulse signal as an input and provides an output to a set input of the R-S flip-flop; and
    a second one-shot pulse generator that receives the second pulse signal as an input and provides an output to a reset input of the R-S flip-flop.

3. The phase comparator of claim 2, wherein:
    the first and second one-shot pulse generators are composed of essentially identical circuit elements.

4. The phase comparator of claim 1, wherein:
    the D-type flip-flop includes
        a logic gate that receives as inputs a delayed first signal and an output of the R-S flip-flop; and
        a latch circuit that latches the output of the logic gate.

5. The phase comparator of claim 4, wherein:
    the logic gate comprises a NAND gate.

6. The phase comparator of claim 4, wherein:
    the latch circuit comprises at least two latch stages connected in a cascade fashion.

7. The phase comparator of claim 1, wherein:
    the phase comparator is composed entirely of complementary metal-insulator-semiconductor field effect transistors.

8. A phase comparator, comprising:
    a first pulse generating circuit for generating first pulses corresponding to a first signal phase of a first signal;
    a second pulse generating circuit for generating second pulses corresponding to a second signal phase of a second signal;
    a pulse receiving circuit that provides a detect output that has a first value in response to a first pulse and a second value in response to a second pulse; and
    an output circuit for logically combining the detect output with a delayed second signal.

9. The phase comparator of claim 8, wherein:
    the first and second pulse generating circuits have an essentially identical circuit structure.

10. The phase comparator of claim 9, wherein:
    each the pulse generator circuits includes a delay unit for providing a delayed signal and a pulse gate for logically combining the delayed signal with a non-delayed signal.

11. The phase comparator of claim 8, wherein:
    the pulse receiving circuit comprises a reset-set flip-flop circuit, having a set input that receives the first pulses and a reset input that receives the second pulses.

12. The phase comparator of claim 8, wherein:
    the output circuit includes
        a logic gate that logically combines the detect output with the delayed second signal to generate a gate output signal; and
        at least one latch that latches the gate output signal.

13. The phase comparator of claim 12, wherein:
    the at least one latch includes a plurality of latch stages that latch the output signal according to the delayed second signal.

14. The phase comparator of claim 8, wherein:
    the first pulse generating circuit, the second pulse generating circuit, the pulse receiving circuit, and the output circuit are formed from complementary insulated gate field effect transistors.

15. A phase comparator, comprising:
    a pulse input circuit that provides a first output value in response to pulses generated from a first signal and a second output value in response to pulses generated from a second signal; and
    an output circuit that includes at least one input gate that outputs either a delayed first signal or a logical combination of the delayed first signal and the output value from the pulse input circuit.

16. The phase comparator of claim 15, wherein:
    the pulse input circuit includes a reset-set flip-flop circuit.

17. The phase comparator of claim 15, wherein:
    the output circuit further includes a plurality latches for latching the output of the at least one input gate in response to a delayed second signal.

18. The phase comparator of claim 15, wherein:
    the at least one input gate includes a NAND gate.

19. The phase comparator of claim 15, further including:
    a first pulse generating circuit for receiving the first signal and generating pulses in response thereto that represent a phase of the first signal; and
    a second pulse generating circuit, having essentially the same structure of the first pulse generating circuit, for receiving the second signal and generating pulses in response thereto that represent a phase of the second signal.

20. The phase comparator of claim 15, wherein:
    the pulse input circuit and output circuit are formed from complementary insulated gate field effect transistors.

* * * * *